(12) United States Patent
Nomaru

(10) Patent No.: US 8,766,137 B2
(45) Date of Patent: Jul. 1, 2014

(54) LASER PROCESSING APPARATUS

(75) Inventor: Keiji Nomaru, Ota-Ku (JP)

(73) Assignee: Disco Corporation, Tokyo (JP)

( * ) Notice: Subject to any disclaimer, the term of this patent is extended or adjusted under 35 U.S.C. 154(b) by 435 days.

(21) Appl. No.: 13/281,984

(22) Filed: Oct. 26, 2011

(65) Prior Publication Data

US 2012/0103952 A1    May 3, 2012

(30) Foreign Application Priority Data

Nov. 2, 2010  (JP) ................................ 2010-246575

(51) Int. Cl.
*B23K 26/02* (2014.01)
*B23K 26/06* (2014.01)
*H01S 3/00* (2006.01)

(52) U.S. Cl.
CPC ................. *B23K 26/02* (2013.01); *B23K 26/06* (2013.01); *H01S 3/00* (2013.01)
USPC .................... 219/121.68; 219/121.73; 372/25

(58) Field of Classification Search
CPC ........ B23K 26/02; B23K 26/06; B23K 26/08; H01S 3/00
USPC ......... 219/121.61–121.75; 372/25; 359/337.5
See application file for complete search history.

(56) References Cited

U.S. PATENT DOCUMENTS

| 7,528,342 | B2 * | 5/2009 | Deshi ........................ 219/121.68 |
| 8,518,803 | B2 * | 8/2013 | Morikazu ..................... 438/463 |
| 8,581,949 | B2 * | 11/2013 | Kaneuchi et al. ............. 347/224 |

FOREIGN PATENT DOCUMENTS

JP           05-277775          10/1993

\* cited by examiner

*Primary Examiner* — Samuel M Heinrich
(74) *Attorney, Agent, or Firm* — Greer Burns & Crain, Ltd.

(57) ABSTRACT

An optical transmitting unit transmits a pulsed laser beam oscillated by a pulsed laser beam oscillator to a focusing unit in a laser processing apparatus. A wavelength band expanding unit expands the wavelength band of the pulsed laser beam, and a pulse width expanding unit increases the pulse width of the expanded pulsed laser beam. A focusing lens focuses the expanded pulsed laser beam. An optical fiber transmits the focused pulsed laser beam through a collimating lens and a pulse width compressing unit compresses the pulse width of the collimated pulsed laser beam to restore the original pulse width for transmission.

3 Claims, 2 Drawing Sheets

LASER PROCESSING APPARATUS

BACKGROUND OF THE INVENTION

1. Field of the Invention

The present invention relates to a laser processing apparatus for applying a pulsed laser beam to a workpiece to laser-process the workpiece.

2. Description of the Related Art

In a semiconductor device fabrication process, a plurality of crossing division lines called streets are formed on the front side of a substantially disk-shaped semiconductor wafer to thereby partition a plurality of bands where devices such as ICs and LSIs are respectively formed. The semiconductor wafer is cut along the streets to thereby divide the bands where the devices are formed from each other, thus obtaining individual semiconductor chips. Further, an optical device wafer is provided by forming photodetectors such as photodiodes or light emitting devices such as laser diodes on the front side of a sapphire substrate. The optical device wafer is also cut along the streets to obtain individual optical devices divided from each other, such as photodiodes and laser diodes, which are widely used in electric equipment.

As a method of dividing a wafer such as a semiconductor wafer and an optical device wafer along the streets, there has been proposed a method including the steps of applying a pulsed laser beam to the wafer along the streets to thereby form laser processed grooves on the wafer or modified layers inside the wafer along the streets and next breaking the wafer along the laser processed grooves or the modified layers. A laser processing apparatus for laser-processing a workpiece such as a wafer includes a chuck table for holding the workpiece and pulsed laser beam applying means for applying a pulsed laser beam to the workpiece held on the chuck table. The pulsed laser beam applying means includes a pulsed laser beam oscillator for oscillating a pulsed laser beam, focusing means for focusing the pulsed laser beam oscillated by the pulsed laser beam oscillator and applying this pulsed laser beam focused to the workpiece held on the chuck table, and optical transmitting means for transmitting the pulsed laser beam oscillated by the pulsed laser beam oscillator to the focusing means.

In general, the optical transmitting means for transmitting the pulsed laser beam oscillated by the pulsed laser beam oscillator to the focusing means is provided by an optical system composed of a lens and a mirror. However, the optical system composed of a lens and a mirror has a problem such that the flexibility of design is low, depending on a set position. To solve this problem, optical transmitting means using an optical fiber has been proposed (see Japanese Patent Laid-open No. Hei 5-277775, for example).

SUMMARY OF THE INVENTION

The optical fiber as the optical transmitting means mentioned above is formed of glass and has a small diameter of about 25 μm to give flexibility. However, the pulsed laser beam oscillated by the pulsed laser beam oscillator has a diameter of 2 to 3 mm. Accordingly, the pulsed laser beam oscillated by the pulsed laser beam oscillator must be focused by a focusing lens onto the center of an end face of the optical fiber. In this manner, the pulsed laser beam oscillated by the pulsed laser beam oscillator is focused to increase a peak power density, and the pulsed laser beam thus having a high peak power density is applied to the center of the end face of the optical fiber. As a result, there arises a problem such that the end face of the optical fiber is early deteriorated by the pulsed laser beam applied thereto.

It is therefore an object of the present invention to provide a laser processing apparatus including optical transmitting means which can transmit the pulsed laser beam oscillated by the pulsed laser beam oscillator to the focusing means without causing damage to the optical fiber.

In accordance with an aspect of the present invention, there is provided a laser processing apparatus including a chuck table for holding a workpiece; and pulsed laser beam applying means for applying a pulsed laser beam to the workpiece held on the chuck table, the pulsed laser beam applying means including a pulsed laser beam oscillator for oscillating a pulsed laser beam of linearly polarized light, focusing means for focusing the pulsed laser beam oscillated by the pulsed laser beam oscillator and applying the pulsed laser beam focused to the workpiece held on the chuck table, and optical transmitting means for transmitting the pulsed laser beam oscillated by the pulsed laser beam oscillator to the focusing means; the optical transmitting means including wavelength band expanding means for expanding the wavelength band of the pulsed laser beam oscillated by the pulsed laser beam oscillator; pulse width expanding means for expanding the pulse width of the pulsed laser beam whose wavelength band has been expanded by the wavelength band expanding means; a focusing lens for focusing the pulsed laser beam whose pulse width has been expanded by the pulse width expanding means; an optical fiber for transmitting the pulsed laser beam focused by the focusing lens; a collimating lens for collimating the pulsed laser beam transmitted by the optical fiber; and pulse width compressing means for compressing the pulse width of the pulsed laser beam collimated by the collimating lens to restore the original pulse width and next transmitting the pulsed laser beam whose pulse width has been restored to the focusing means.

Preferably, the wavelength band expanding means includes a rod type photonics crystal fiber, a focusing lens provided on the entrance side of the rod type photonics crystal fiber for focusing the pulsed laser beam oscillated by the pulsed laser beam oscillator, and a collimating lens provided on the emergence side of the rod type photonics crystal fiber for collimating the pulsed laser beam emerging from the rod type photonics crystal fiber.

Preferably, the pulse width expanding means includes a first beam splitter for transmitting the pulsed laser beam whose wavelength band has been expanded by the wavelength band expanding means, a first quarter-wave plate for converting the pulsed laser beam transmitted by the first beam splitter into a pulsed laser beam of circularly polarized light, and a pulse width expanding element for expanding the pulse width of the pulsed laser beam of circularly polarized light obtained by the first quarter-wave plate and reflecting the pulsed laser beam over the wavelength band, wherein the pulsed laser beam of circularly polarized light from the first quarter-wave plate is reflected by the pulse width expanding element to reverse the rotational direction of circularly polarized light, and next introduced again into the first quarter-wave plate to obtain a pulsed laser beam of secondary linearly polarized light whose polarization plane has been rotated 90°, and next guided through the first beam splitter to the focusing lens.

Preferably, the pulse width compressing means includes a second beam splitter for transmitting the pulsed laser beam collimated by the collimating lens, a second quarter-wave plate for converting the pulsed laser beam transmitted by the second beam splitter into a pulsed laser beam of circularly polarized light, and a pulse width compressing element for compressing the pulse width of the pulsed laser beam of circularly polarized light obtained by the second quarter-wave plate and reflecting the pulsed laser beam over the wavelength band, wherein the pulsed laser beam of circularly polarized light from the second quarter-wave plate is reflected by the pulse width compressing element to reverse the rotational direction of circularly polarized light, next introduced again into the second quarter-wave plate to 90° rotate the polarization plane, thereby returning the pulsed laser beam of secondary linearly polarized light to the pulsed laser beam oscillated by the pulsed laser beam oscillator, and next guided through the second beam splitter to the focusing means.

In the laser processing apparatus according to the present invention, the pulse width of the pulsed laser beam oscillated by the pulsed laser beam oscillator is expanded by the pulse width expanding means, thereby reducing the peak power density of the pulsed laser beam. Thereafter, the pulsed laser beam is introduced into the optical fiber. Further, the pulse width of the pulsed laser beam emerging from the optical fiber is returned to the original pulse width by the pulse width compressing means, thereby restoring the original peak power density. Thereafter, the pulsed laser beam is guided to the focusing means. Accordingly, the workpiece can be subjected to desired processing without causing damage to the optical fiber.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
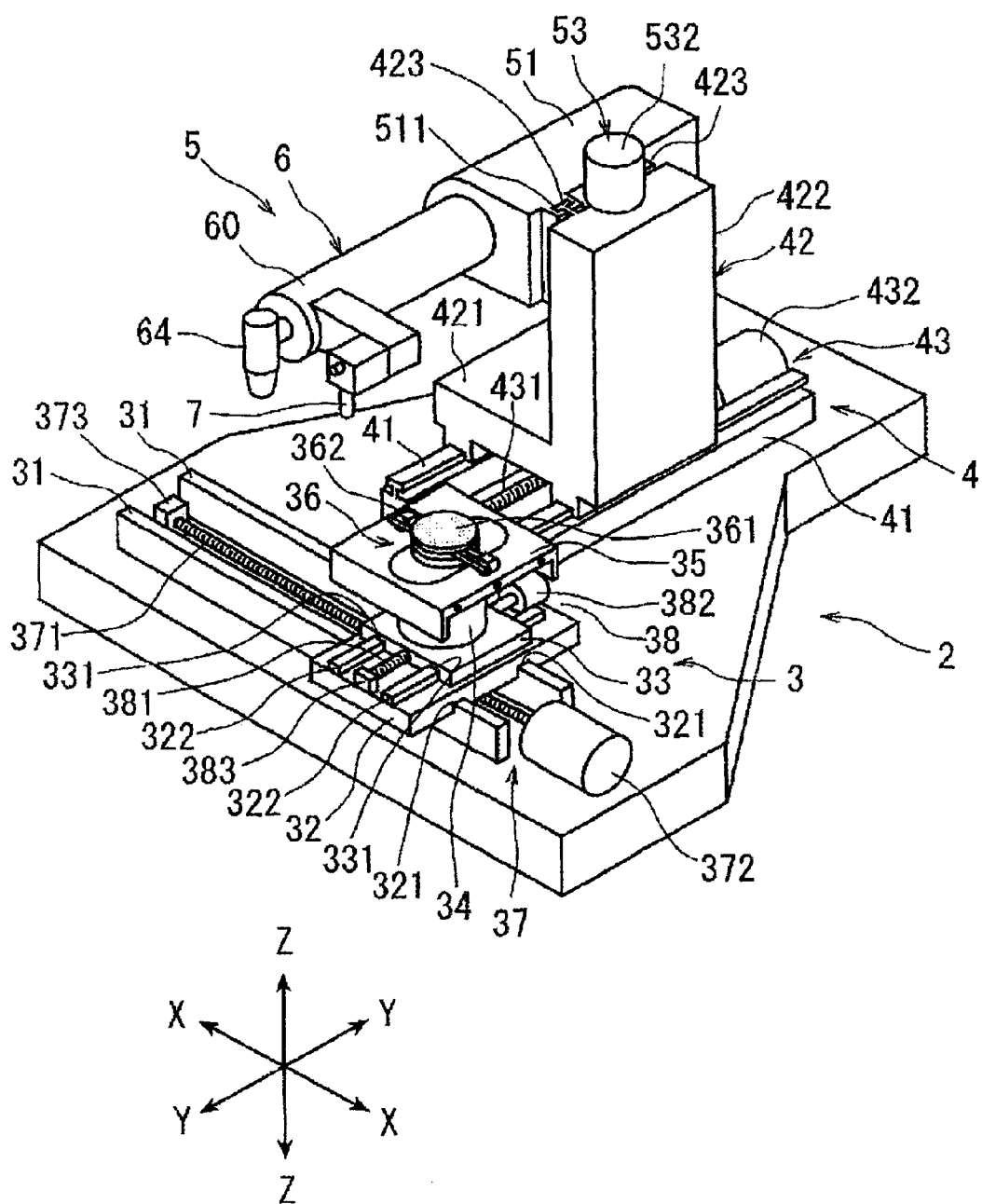
FIG. 1 is a perspective view of a laser processing apparatus according to the present invention.

A preferred embodiment of the laser processing apparatus according to the present invention will now be described in detail with reference to the attached drawings. FIG. 1 is a perspective view of a laser processing apparatus according to a preferred embodiment of the present invention. The laser processing apparatus shown in FIG. 1 includes a stationary base 2, a chuck table mechanism 3 for holding a workpiece, the chuck table mechanism 3 being provided on the stationary base 2 so as to be movable in a feeding direction (X direction) shown by an arrow X, a laser beam applying unit supporting mechanism 4 provided on the stationary base 2 so as to be movable in an indexing direction (Y direction) shown by an arrow Y perpendicular to the X direction, and a laser beam applying unit 5 provided on the laser beam applying unit supporting mechanism 4 so as to be movable in a focal position adjusting direction (Z direction) shown by an arrow Z perpendicular to a holding surface of a chuck table to be hereinafter described.

The chuck table mechanism 3 includes a pair of guide rails 31, 31 provided on the stationary base 2 so as to extend parallel to each other in the X direction, a first slide block 32 provided on the guide rails 31 so as to be movable in the X direction, a second slide block 33 provided on the first slide block 32 so as to be movable in the Y direction, a cover table 35 supported by a cylindrical member 34 standing on the second slide block 33, and a chuck table 36 as workpiece holding means. The chuck table 36 has a vacuum chuck 361 formed of a porous material. A workpiece such as a disk-shaped semiconductor wafer is adapted to be held under suction on the vacuum chuck 361 as a workpiece holding surface by operating suction means (not shown). The chuck table 36 is rotatable by a pulse motor (not shown) provided in the cylindrical member 34. Further, the chuck table 36 is provided with clamps 362 for fixing an annular frame (not shown) supporting the wafer.

The lower surface of the first slide block 32 is formed with a pair of guided grooves 321, 321 for slidably engaging the pair of guide rails 31, 31 mentioned above. A pair of guide rails 322, 322 are provided on the upper surface of the first slide block 32 so as to extend parallel to each other in the Y direction. Accordingly, the first slide block 32 is movable in the X direction along the guide rails 31, 31 by the slidable engagement of the guided grooves 321, 321 with the guide rails 31, 31. The chuck table mechanism 3 further includes feeding means 37 provided by a ball screw mechanism for moving the first slide block 32 in the X direction along the guide rails 31, 31. The feeding means 37 includes an externally threaded rod 371 extending parallel to the guide rails 31, 31 so as to be interposed therebetween and a pulse motor 372 as a drive source for rotationally driving the externally threaded rod 371. The externally threaded rod 371 is rotatably supported at one end thereof to a bearing block 373 fixed to the stationary base 2 and is connected at the other end to the output shaft of the pulse motor 372 so as to receive the torque thereof. The externally threaded rod 371 is engaged with a tapped through hole formed in an internally threaded block (not shown) projecting from the lower surface of the first slide block 32 at a central portion thereof. Accordingly, the first slide block 32 is moved in the X direction along the guide rails 31, 31 by operating the pulse motor 372 to normally or reversely rotate the externally threaded rod 371.

The lower surface of the second slide block 33 is formed with a pair of guided grooves 331, 331 for slidably engaging the pair of guide rails 322, 322 provided on the upper surface of the first slide block 32 as mentioned above. Accordingly, the second slide block 33 is movable in the Y direction along the guide rails 322 by the slidable engagement of the guided grooves 331, 331 with the guide rails 322, 322. The chuck table mechanism 3 according to the embodiment further includes first indexing means 38 provided by a ball screw mechanism for moving the second slide block 33 in the Y direction along the pair of guide rails 322, 322 provided on the first slide block 32. The first indexing means 38 includes an externally threaded rod 381 extending parallel to the guide rails 322 and 322 so as to be interposed therebetween and a pulse motor 382 as a drive source for rotationally driving the externally threaded rod 381. The externally threaded rod 381 is rotatably supported at one end thereof to a bearing block 383 fixed to the upper surface of the first slide block 32 and is connected at the other end to the output shaft of the pulse motor 382 so as to receive the torque thereof. The externally threaded rod 381 is engaged with a tapped through hole formed in an internally threaded block (not shown) projecting from the lower surface of the second slide block 33 at a central portion thereof. Accordingly, the second slide block 33 is moved in the Y direction along the guide rails 322, 322 by operating the pulse motor 382 to normally or reversely rotate the externally threaded rod 381.

The laser beam applying unit supporting mechanism 4 includes a pair of guide rails 41, 41 provided on the stationary base 2 so as to extend parallel to each other in the Y direction and a movable support base 42 provided on the guide rails 41, 41 so as to be movable in the Y direction. The movable support base 42 is composed of a horizontal portion 421 slidably supported to the guide rails 41, 41 and a vertical portion 422 extending vertically upward from the upper surface of the horizontal portion 421. Further, a pair of guide rails 423, 423 are provided on one side surface of the vertical portion 422 so as to extend parallel to each other in the Z direction. The laser beam applying unit supporting mechanism 4 further includes second indexing means 43 provided by a ball screw mechanism for moving the movable support base 42 in the Y direction along the guide rails 41, 41. The second indexing means 43 includes an externally threaded rod 431 extending parallel to the guide rails 41, 41 so as to be interposed therebetween and a pulse motor 432 as a drive source for rotationally driving the externally threaded rod 431. The externally threaded rod 431 is rotatably supported at one end thereof to a bearing block (not shown) fixed to the stationary base 2 and is connected at the other end to the output shaft of the pulse motor 432 so as to receive the torque thereof. The externally threaded rod 431 is engaged with a tapped through hole formed in an internally threaded block (not shown) projecting from the lower surface of the horizontal portion 421 constituting the movable support base 42 at a central portion of the horizontal portion 421. Accordingly, the movable support base 42 is moved in the Y direction along the guide rails 41, 41 by operating the pulse motor 432 to normally or reversely rotate the externally threaded rod 431.

The laser beam applying unit 5 includes a unit holder 51 and pulsed laser beam applying means 6 mounted to the unit holder 51. The unit holder 51 is formed with a pair of guided grooves 511, 511 for slidably engaging the pair of guide rails 423, 423 provided on the vertical portion 422 of the movable support base 42. Accordingly, the unit holder 51 is supported to the movable support base 42 so as to be movable in the Z direction by the slidable engagement of the guided grooves 511, 511 with the guide rails 423, 423.

The laser beam applying unit 5 further includes focal position adjusting means 53 for moving the unit holder 51 along the guide rails 423, 423 in the Z direction. Like the feeding means 37, the first indexing means 38, and the second indexing means 43, the focal position adjusting means 53 is provided by a ball screw mechanism. That is, the focal position adjusting means 53 includes an externally threaded rod (not shown) extending parallel to the guide rails 423, 423 so as to be interposed therebetween and a pulse motor 532 as a drive source for rotationally driving this externally threaded rod. Accordingly, the unit holder 51 and the pulsed laser beam applying means 6 are moved in the Z direction along the guide rails 423, 423 by operating the pulse motor 532 to normally or reversely rotate this externally threaded rod. In this preferred embodiment, when the pulse motor 532 is normally operated, the pulsed laser beam applying means 6 is moved upward, whereas when the pulse motor 532 is reversely operated, the pulsed laser beam applying means 6 is moved downward.

The pulsed laser beam applying means 6 includes a cylindrical casing 60 fixed to the unit holder 51 so as to extend in a substantially horizontal direction. Imaging means 7 is mounted on the front end portion of the cylindrical casing 60. The imaging means 7 functions to detect a subject area of the workpiece to be laser-processed by the pulsed laser beam applying means 6. The imaging means 7 includes an imaging device (infrared CCD), and an image signal output from the imaging means 7 is transmitted to control means (not shown).

Figure 2:
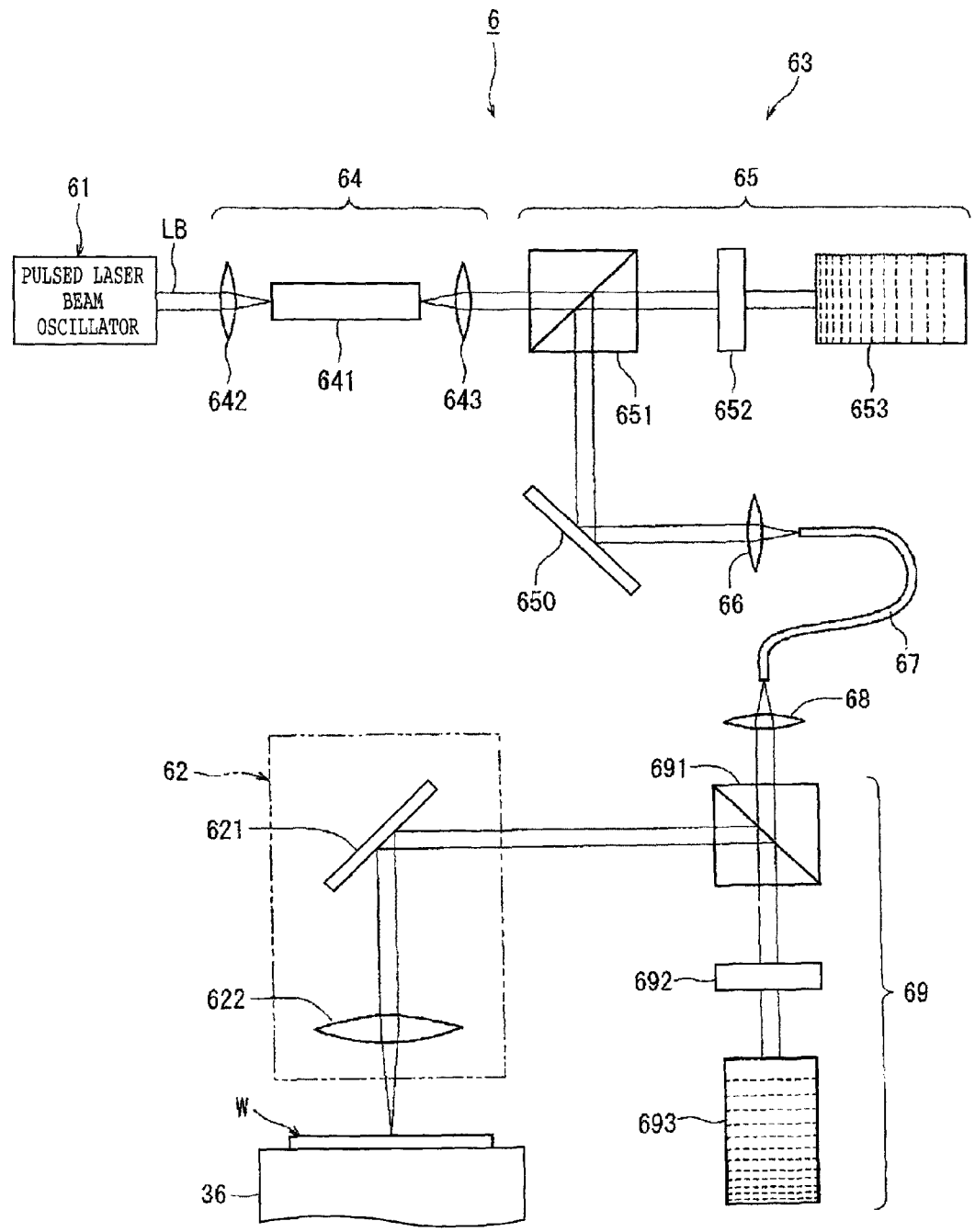
FIG. 2 is a schematic block diagram showing the configuration of pulsed laser beam applying means included in the laser processing apparatus shown in FIG. 1.

As shown in FIG. 2, the pulsed laser beam applying means 6 includes a pulsed laser beam oscillator 61 provided in the casing 60 for oscillating a pulsed laser beam LB of linearly polarized light, focusing means 62 provided at the front end of the casing 60 for focusing the pulsed laser beam LB oscillated by the pulsed laser beam oscillator 61 and applying this pulsed laser beam LB to a workpiece W held on the chuck table 36, and optical transmitting means 63 for transmitting the pulsed laser beam LB oscillated by the pulsed laser beam oscillator 61 to the focusing means 62.

The pulsed laser beam oscillator 61 is provided by a YAG laser oscillator or a YVO4 laser oscillator. The pulsed laser beam LB to be oscillated by the pulsed laser beam oscillator 61 is set as follows:
Wavelength: 1030 nm
Pulse width: 10 ps
Repetition frequency: 200 kHz
Power: 3 W
Diameter: 3.5 mm The focusing means 62 includes a direction changing mirror 621 for changing the traveling direction of the pulsed laser beam emerging from the optical transmitting means 63 to a downward direction as viewed in FIG. 2 and a focusing lens 622 for focusing the pulsed laser beam reflected by the direction changing mirror 621 and applying this pulsed laser beam to the workpiece W held on the chuck table 36.

The optical transmitting means 63 will now be described in detail. The optical transmitting means 63 shown in FIG. 2 includes wavelength band (region) expanding means 64 for expanding the wavelength band of the pulsed laser beam LB oscillated by the pulsed laser beam oscillator 61, pulse width expanding means 65 for expanding the pulse width of the pulsed laser beam whose wavelength band has been expanded by the wavelength band expanding means 64, a focusing lens 66 for focusing the pulsed laser beam whose pulse width has been expanded by the pulse width expanding means 65, an optical fiber 67 for transmitting the pulsed laser beam focused by the focusing lens 66, a collimating lens 68 for collimating the pulsed laser beam transmitted by the optical fiber 67, and pulse width compressing means 69 for compressing the pulse width of the pulsed laser beam collimated by the collimating lens 68 to restore the original pulse width and next transmitting the pulsed laser beam whose pulse width has been restored to the focusing means 62.

The wavelength band expanding means 64 includes a rod type photonics crystal fiber 641, a focusing lens 642 provided on the entrance side of the rod type photonics crystal fiber 641 for focusing the pulsed laser beam oscillated by the pulsed laser beam oscillator 61, and a collimating lens 643 provided on the emergence side of the rod type photonics crystal fiber 641 for collimating the pulsed laser beam emerging from the rod type photonics crystal fiber 641. The diameter of the rod type photonics crystal fiber 641 is set to 100 μm, for example. Accordingly, it is sufficient that the pulsed laser beam oscillated by the pulsed laser beam oscillator 61 must be focused by the focusing lens 642 so that the diameter of the pulsed laser beam becomes about 100 μm. As a result, there is no possibility that the power density of the pulsed laser beam entering the rod type photonics crystal fiber 641 may be extremely increased. The pulsed laser beam of linearly polarized light oscillated by the pulsed laser beam oscillator 61 is transmitted by the rod type photonics crystal fiber 641 to thereby expand the wavelength band of the pulsed laser beam.

The pulse width expanding means 65 includes a first beam splitter 651 for transmitting the pulsed laser beam whose wavelength band has been expanded by the wavelength band expanding means 64, a first quarter-wave plate 652 for converting the pulsed laser beam of linearly polarized light transmitted by the first beam splitter 651 into a pulsed laser beam of circularly polarized light, and a pulse width expanding element 653 for expanding the pulse width of the pulsed laser beam of circularly polarized light obtained by the first quarter-wave plate 652 and reflecting the pulsed laser beam over the wavelength band. The pulse width expanding element 653 is provided by a Volume Bragg Grating for expanding the pulse width by delaying the dispersion of light. The pulse width expanding element 653 is so configured as to sequentially reflect the pulsed laser beam from a shorter wavelength band to a longer wavelength band. For example, the wavelength band of the pulsed laser beam oscillated by the pulsed laser beam oscillator 61 is expanded from 1030 nm to 1020 to 1040 nm by the wavelength band expanding means 64. In this case, the pulsed laser beam is reflected by the pulse width expanding element 653 over the wavelength band ranging from 1020 to 1040 nm, thereby expanding the pulse width of the pulsed laser beam. For example, the pulse width of the pulsed laser beam oscillated by the pulsed laser beam oscillator 61 is expanded from 10 ps to 200 ps. The pulsed laser beam of circularly polarized light from the first quarter-wave plate 652 is reflected by the pulse width expanding element 653 to reverse the rotational direction of circularly polarized light. The pulsed laser beam from the pulse width expanding element 653 is introduced again into the first quarter-wave plate 652 to obtain a pulsed laser beam of secondary linearly polarized light whose polarization plane has been rotated 90° (linearly polarized light obtained by 90° rotating the polarization plane of the pulsed laser beam oscillated by the pulsed laser beam oscillator 61). Thereafter, the pulsed laser beam of secondary linearly polarized light is guided through the first beam splitter 651 and a direction changing mirror 650 to the focusing lens 66.

The pulsed laser beam of secondary linearly polarized light thus guided to the focusing lens 66 is focused by the focusing lens 66 to enter one end of the optical fiber 67. For example, the diameter of the optical fiber 67 is set to 25 μm in the embodiment. Accordingly, the pulsed laser beam is focused by the focusing lens 66 so that the diameter of the pulsed laser beam becomes 25 μm or less. However, the pulse width of the pulsed laser beam entering the optical fiber 67 has been expanded as mentioned above, so that the peak power density of the pulsed laser beam entering the optical fiber 67 has been reduced, thereby preventing damage to the optical fiber 67. The pulsed laser beam of secondary linearly polarized light entering one end of the optical fiber 67 is transmitted by the optical fiber 67 and emerges from the other end of the optical fiber 67. The pulsed laser beam of secondary linearly polarized light emerging from the other end of the optical fiber 67 is collimated by the collimating lens 68 to enter the pulse width compressing means 69.

The pulse width compressing means 69 includes a second beam splitter 691 for transmitting the pulsed laser beam of secondary linearly polarized light collimated by the collimating lens 68, a second quarter-wave plate 692 for converting the pulsed laser beam of secondary linearly polarized light transmitted by the second beam splitter 691 into a pulsed laser beam of circularly polarized light, and a pulse width compressing element 693 for compressing the pulse width of the pulsed laser beam of circularly polarized light obtained by the second quarter-wave plate 692 and reflecting the pulsed laser beam over the wavelength band. The pulse width compressing element 693 is provided by a Volume Bragg Grating. The pulse width compressing element 693 is so configured as to reflect the pulsed laser beam in the order reversed to that of the pulse width expanding element 653 of the pulse width expanding means 65, i.e., sequentially reflect the pulsed laser beam from the longer wavelength band (1040 nm) to the shorter wavelength band (1020 nm).

Accordingly, the pulsed laser beam whose pulse width has been expanded by the pulse width expanding element 653 of the pulse width expanding means 65 is reflected over the wavelength band by the pulse width compressing element 693 to restore the original pulse width (10 ps in this preferred embodiment). The pulsed laser beam of circularly polarized light from the second quarter-wave plate 692 is reflected by the pulse width compressing element 693 to reverse the rotational direction of circularly polarized light. The pulsed laser beam from the pulse width compressing element 693 is introduced again into the second quarter-wave plate 692 to 90° rotate the polarization plane, thereby returning the pulsed laser beam of secondary linearly polarized light to the original pulsed laser beam of linearly polarized light oscillated by the pulsed laser beam oscillator 61. Thereafter, the pulsed laser beam is guided through the second beam splitter 691 to the focusing means 62. As described above, the pulse width of the pulsed laser beam expanded by the pulse width expanding element 653 of the pulse width expanding means 65 is returned to the original pulse width by the pulse width compressing element 693, thereby restoring the original peak power density. Accordingly, the workpiece can be subjected to desired processing.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser processing apparatus comprising:
    a chuck table for holding a workpiece; and
    pulsed laser beam applying means for applying a pulsed laser beam to said workpiece held on said chuck table, said pulsed laser beam applying means including a pulsed laser beam oscillator for oscillating a pulsed laser beam of linearly polarized light, focusing means for focusing said pulsed laser beam oscillated by said pulsed laser beam oscillator and applying said pulsed laser beam focused to said workpiece held on said chuck table, and optical transmitting means for transmitting said pulsed laser beam oscillated by said pulsed laser beam oscillator to said focusing means,
    said optical transmitting means including
    wavelength band expanding means for expanding the wavelength band of said pulsed laser beam oscillated by said pulsed laser beam oscillator,
    pulse width expanding means for expanding the pulse width of said pulsed laser beam whose wavelength band has been expanded by said wavelength band expanding means,
    a focusing lens for focusing said pulsed laser beam whose pulse width has been expanded by said pulse width expanding means,
    an optical fiber for transmitting said pulsed laser beam focused by said focusing lens,
    a collimating lens for collimating said pulsed laser beam transmitted by said optical fiber, and
    pulse width compressing means for compressing the pulse width of said pulsed laser beam collimated by said collimating lens to restore the original pulse width and next transmitting said pulsed laser beam whose pulse width has been restored to said focusing means.

2. The laser processing apparatus according to claim 1, wherein said wavelength band expanding means includes a rod type photonics crystal fiber, a focusing lens provided on the entrance side of said rod type photonics crystal fiber for focusing said pulsed laser beam oscillated by said pulsed laser beam oscillator, and a collimating lens provided on the emergence side of said rod type photonics crystal fiber for collimating said pulsed laser beam emerging from said rod type photonics crystal fiber.

3. The laser processing apparatus according to claim 1, wherein:

said pulse width expanding means includes a first beam splitter for transmitting said pulsed laser beam whose wavelength band has been expanded by said wavelength band expanding means, a first quarter-wave plate for converting said pulsed laser beam transmitted by said first beam splitter into a pulsed laser beam of circularly polarized light, and a pulse width expanding element for expanding the pulse width of said pulsed laser beam of circularly polarized light obtained by said first quarter-wave plate and reflecting said pulsed laser beam over the wavelength band, wherein said pulsed laser beam of circularly polarized light from said first quarter-wave plate is reflected by said pulse width expanding element to reverse the rotational direction of circularly polarized light, and next introduced again into said first quarter-wave plate to obtain a pulsed laser beam of secondary linearly polarized light whose polarization plane has been rotated 90°, and next guided through said first beam splitter to said focusing lens; and said pulse width compressing means includes a second beam splitter for transmitting said pulsed laser beam collimated by said collimating lens, a second quarter-wave plate for converting said pulsed laser beam transmitted by said second beam splitter into a pulsed laser beam of circularly polarized light, and a pulse width compressing element for compressing the pulse width of said pulsed laser beam of circularly polarized light obtained by said second quarter-wave plate and reflecting said pulsed laser beam over the wavelength band, wherein said pulsed laser beam of circularly polarized light from said second quarter-wave plate is reflected by said pulse width compressing element to reverse the rotational direction of circularly polarized light, next introduced again into said second quarter-wave plate to 90° rotate the polarization plane, thereby returning said pulsed laser beam of secondary linearly polarized light to said pulsed laser beam oscillated by said pulsed laser beam oscillator, and next guided through said second beam splitter to said focusing means.

* * * * *